United States Patent
Lim et al.

(10) Patent No.: US 7,667,253 B2
(45) Date of Patent: Feb. 23, 2010

(54) NON-VOLATILE MEMORY DEVICE WITH CONDUCTIVE SIDEWALL SPACER AND METHOD FOR FABRICATING THE SAME

(75) Inventors: Kwan-Yong Lim, Ichon-shi (KR); Heung-Jae Cho, Ichon-shi (KR); Yong-Soo Kim, Ichon-shi (KR); Se-Aug Jang, Ichon-shi (KR); Hyun-Chul Sohn, Ichon-shi (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 300 days.

(21) Appl. No.: 11/790,957

(22) Filed: Apr. 30, 2007

(65) Prior Publication Data

US 2007/0200145 A1 Aug. 30, 2007

Related U.S. Application Data

(62) Division of application No. 11/024,472, filed on Dec. 30, 2004, now Pat. No. 7,217,624.

(30) Foreign Application Priority Data

Oct. 1, 2004 (KR) .......................... 2004-0078223

(51) Int. Cl.
*H01L 27/108* (2006.01)
*H01L 29/94* (2006.01)

(52) U.S. Cl. ..................... 257/295; 257/296; 257/301; 257/E21.196; 257/E21.636; 257/E21.438

(58) Field of Classification Search ................. 257/295, 257/296, 301, 300, 310, 303, 309, 752, 753, 257/368, 763, 764, 765, 767, E21.196, E21.636, 257/E21.438
See application file for complete search history.

(56) References Cited

U.S. PATENT DOCUMENTS 5,760,435 A 6/1998 Pan (Continued)

FOREIGN PATENT DOCUMENTS

KR 1998-073410 11/1998

(Continued)

OTHER PUBLICATIONS

German Office Action issued in German Patent Application No. DE 10 2004 063 690.7-33, dated Oct. 7, 2008.

*Primary Examiner*—Walter L Lindsay, Jr.
(74) *Attorney, Agent, or Firm*—IP & T Law Firm PLC

(57) ABSTRACT

The present invention relates to a non-volatile memory device having conductive sidewall spacers and a method for fabricating the same. The non-volatile memory device includes: a substrate; a gate insulation layer formed on the substrate; a gate structure formed on the gate insulation layer; a pair of sidewall spacers formed on sidewalls of the gate structure; a pair of conductive sidewall spacers for trapping/detrapping charges formed on the pair of sidewall spacers; a pair of lightly doped drain regions formed in the substrate disposed beneath the sidewalls of the gate structure; and a pair of source/drain regions formed in the substrate disposed beneath edge portions of the pair of conductive sidewall spacers.

11 Claims, 9 Drawing Sheets

U.S. PATENT DOCUMENTS

| | | |
|---|---|---|
| 6,043,545 A | 3/2000 | Tseng et al. |
| 6,140,171 A | 10/2000 | Allen et al. |
| 6,207,507 B1 | 3/2001 | Wang |
| 6,207,519 B1 | 3/2001 | Kim et al. |
| 6,297,093 B1 | 10/2001 | Borel et al. |
| 6,399,451 B1 | 6/2002 | Lim et al. |
| 6,528,404 B2 | 3/2003 | Kim |
| 2005/0218445 A1 | 10/2005 | Van Duuren et al. |

FOREIGN PATENT DOCUMENTS

| | | |
|---|---|---|
| KR | 1998-073410 A | 11/1998 |
| KR | 10-0206985 B | 4/1999 |
| KR | 2002-0019139 A | 3/2002 |

NON-VOLATILE MEMORY DEVICE WITH CONDUCTIVE SIDEWALL SPACER AND METHOD FOR FABRICATING THE SAME

RELATED APPLICATIONS

The present application is a Divisional of U.S. application Ser. No. 11/024,472, filed on Dec. 30, 2004, now U.S. Pat. No. 7,217,624 which claims priority of Korean Application No. 2004-0078223 filed Oct. 1, 2004, the contents of which are hereby incorporated by reference.

FIELD OF THE INVENTION

The present invention relates to a semiconductor memory device; and, more particularly, to a non-volatile memory device with a pair of polysilicon-based sidewall spacers and a method for fabricating the same.

DESCRIPTION OF RELATED ARTS

Generally, semiconductor memory devices are classified into a volatile memory device and a non-volatile memory device. The volatile memory device loses stored data when power supply is stopped. On the contrary, the non-volatile memory device retains stored data even if the power supply is stopped. Therefore, the non-volatile memory device is widely used when power cannot be supplied and low power supply is demanded. For instance, the non-volatile memory device can be applied to a mobile communication system and a memory card for storing music and/or image data.

Among various non-volatile memory devices, a flash memory is a representative non-volatile memory device using floating gates for storing data. The flash memory changes information stored in transistors of a cell region through a programming operation and an erasing operation. At this time, the programming operation and the erasing operation require a high voltage level greater than about 10 V, and the flash memory includes a plurality of pumping circuits in a peripheral circuit region to generate a high voltage level. As the number of pumping circuit increases, the semiconductor device has been less integrated but the price increases conversely. Also, there is a difficulty in fabricating the flash memory without generating a breakdown in transistors and interconnection lines even in a high voltage level.

Furthermore, the flash memory has a longer retention time than that of other non-volatile memory devices. However, a high voltage level is required and operation speed of the flash memory becomes slow. When the floating gates are disposed to be perpendicular to gate electrodes, the large scale of integration can be easily obtained; however, it is difficult to apply an etching process and form contacts. Therefore, a non-volatile memory device having a structure of silicon/oxide/nitride/oxide/silicon (SONOS) has been actively studied.

The non-volatile memory device with the SONOS structure is obtained by sequentially stacking a first oxide layer, a nitride layer, a second oxide layer and a polycrystal silicon layer on a substrate. Herein, the nitride layer disposed between the first oxide layer and the second oxide layer serves as a charge trapping medium which is for storing information of the SONOS type non-volatile memory device. Hence, the nitride layer performs a similar function to that of the floating gate of the flash memory.

However, a typical type of a non-volatile memory device uses a charge trapping/detrapping method at a quantum well created at the ONO structure or at an interface between the first oxide layer and the second oxide layer of the ONO structure and thus, there may be problems related to a retention time and durability of a gate oxide layer. Also, there is a difficulty in scaling down the devices. Therefore, it is proposed to form a charge trapping medium in a sidewall spacer type to solve the problems related to the ONO structure.

FIG. 1 is a cross-sectional view showing a conventional SONOS type non-volatile memory device having a charge trapping medium in the form of a sidewall spacer.

As shown, the SONOS type non-volatile memory device includes: a gate insulation layer 12 formed on a substrate 11; a gate electrode 13; a pair of first silicon oxide ($SiO_2$)-based sidewall spacers 15A formed on sidewalls of the gate electrode 13; a pair of silicon nitride (SiN)-based sidewall spacers 14 formed on the pair of first $SiO_2$-based sidewall spacers 15A; a pair of second silicon oxide ($SiO_2$)-based sidewall spacers 15B formed on the pair of SiN-based sidewall spacers 14; and a source S and a drain D formed in the substrate 11.

In the SONOS type non-volatile memory device, the pair of SiN-based sidewall spacers 14 serves a role in storing a bit A and a bit B, and thus, it is possible to obtain 2 bits per cell. Despite of this advantage, the SONOS type non-volatile memory device has a problem of a degraded reliability as like a common ONO dielectric structure since charges are trapped or detrapped at the pair of SiN-based sidewall spacers 14.

FIG. 2A is a schematic graph showing a threshold voltage characteristic depending on a charging state in a conventional SONOS type non-volatile memory device having a charge trapping medium in the form of a sidewall spacer type. In the graph, the horizontal axis and the vertical axis represent a gate voltage (Vg) and a drain current (Id), respectively.

In detail, when negative charges are stored into a source region, a low bias voltage is applied to the source region while a high bias voltage is applied to a drain region. Then, a threshold voltage is shifted to a positive direction, i.e., to a 'Forward' direction in the graph. Conversely, when a high bias voltage is applied to the source region while a low bias voltage is applied to the drain region, the threshold voltage is shifted to a 'Reverse' direction. Even more, in this case, the threshold voltage exhibits a 'Fresh' state that a bare amount of charges exists.

FIG. 2B is a graph showing a characteristic of a threshold voltage (Vth) exhibited during fresh, writing and erasing operations in a conventional SONOS type non-volatile memory device having a charge trapping medium in the form of a sidewall spacer type. Herein, the horizontal axis and the vertical axis represent a gate voltage (Vg) and a drain current (Id), respectively.

As shown, after the erasing operation, a characteristic between the gate voltage (Vg) and the drain current (Id), i.e., the threshold voltage characteristic, becomes degraded.

As described above, when the nitride layer is used as the charge trapping medium in the non-volatile memory device, charges can be trapped into an inner side of the nitride layer and into an interface between the oxide layer and the nitride layer. Therefore, it may be difficult to control amounts of charges to be trapped or detrapped.

SUMMARY OF THE INVENTION

It is, therefore, an object of the present invention to provide a non-volatile memory device capable of improving reliability when a nitride layer is used as a charge trapping medium and a method for fabricating the same.

In accordance with an aspect of the present invention, there is provided a non-volatile memory device, including: a substrate; a gate insulation layer formed on the substrate; a gate structure formed on the gate insulation layer; a pair of sidewall spacers formed on sidewalls of the gate structure; a pair of conductive sidewall spacers for trapping/detrapping charges formed on the pair of sidewall spacers; a pair of lightly doped drain regions formed in the substrate disposed beneath the sidewalls of the gate structure; and a pair of source/drain regions formed in the substrate disposed beneath edge portions of the pair of conductive sidewall spacers.

In accordance with another aspect of the present invention, there is provided a method for fabricating a non-volatile memory device, including the steps of: forming a gate insulation layer on a substrate; forming a gate structure on the gate insulation layer; forming a pair of lightly doped drain regions in the substrate disposed beneath sidewalls of the gate structure; forming a pair of re-oxidation sidewall spacers on sidewalls of the gate structure; simultaneously forming a pair of sidewall spacers and a pair of conductive sidewall spacers on the pair of re-oxidation sidewall spacers; and forming a pair of source/drain regions formed in the substrate disposed beneath edge portions of the pair of conductive sidewall spacers and connected with the respective lightly doped drain regions.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A non-volatile memory device with conductive sidewall spacers and a method for fabricating the same in accordance with a preferred embodiment of the present invention will be described in detail with reference to the accompanying drawings, which is set forth hereinafter.

Figure 1:
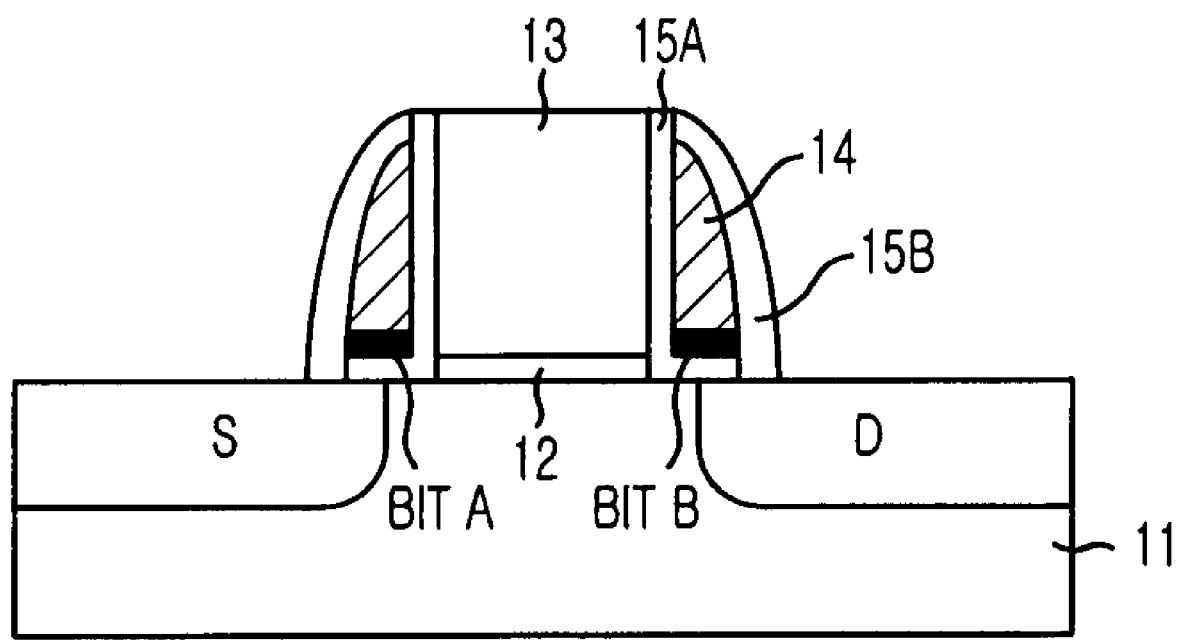
FIG. 1 is a cross-sectional view showing a conventional silicon/oxide/nitride/oxide/silicon (SONOS) type non-volatile memory device having a charge trapping medium in the form of a sidewall spacer.
Figure 2A:
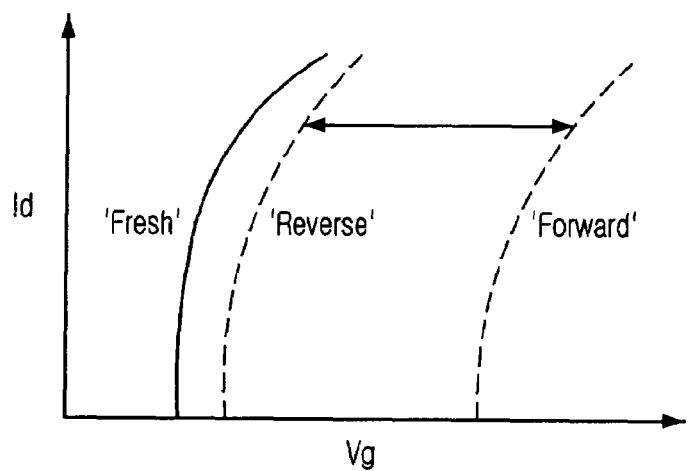
FIG. 2A is a schematic graph showing a threshold voltage characteristic depending on a charging state in a conventional SONOS type non-volatile memory device in the form of a sidewall spacer.
Figure 2B:
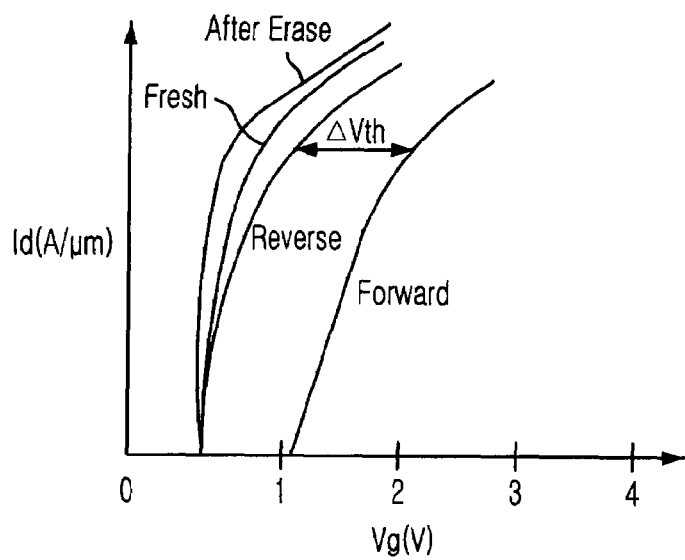
FIG. 2B is a graph showing a threshold voltage characteristic during fresh, writing and erasing operations in a conventional SONOS type non-volatile memory device in the form of a sidewall spacer.
Figure 3:
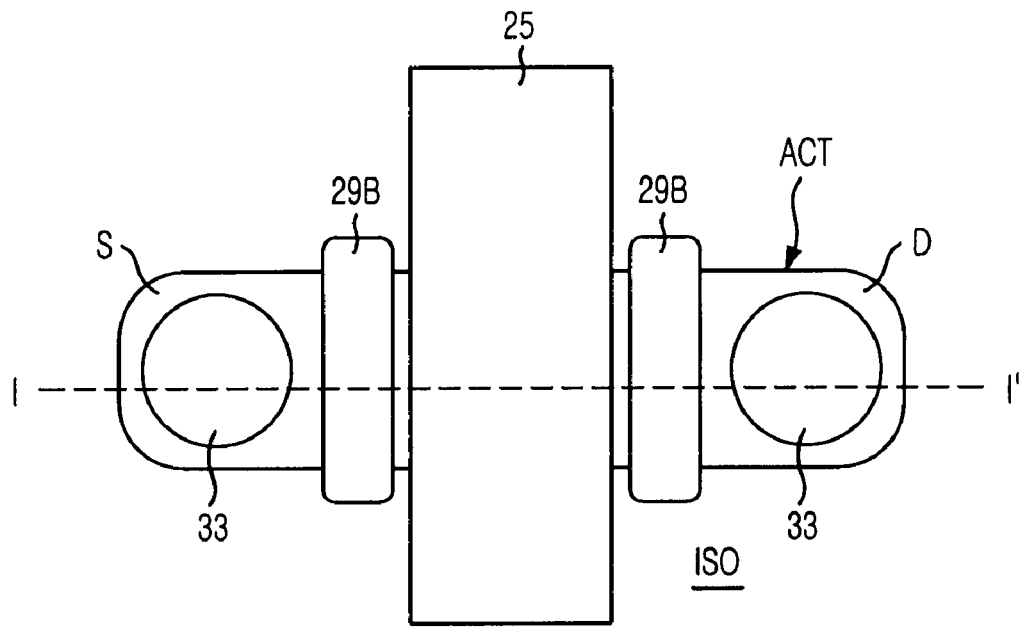
FIG. 3 is a diagram showing a layout of a cell transistor in a non-volatile memory device in accordance with the present invention.

FIG. 3 is a diagram showing a layout of a cell transistor in a non-volatile memory device in accordance with the present invention.

As shown, the cell transistor of the non-volatile memory device includes: a device isolation layer ISO formed in a predetermined region of a substrate; a word line 25 formed in an active region ACT of the substrate defined by the device isolation layer ISO; a pair of conductive sidewall spacers 29B formed on both sidewalls of the word line 25; a source region S and a drain region D formed within respective portions of the active region ACT disposed beneath edge portions of the conductive sidewall spacers 29B; and a plurality of bit line contacts 33 connected with the source region S and the drain region D. Particularly, the conductive sidewall spacers 29B are formed by using polysilicon and functions as charge trapping/detrapping media. Also, the conductive sidewall spacers 29B are also called floating sidewall spacers.

Figure 4:
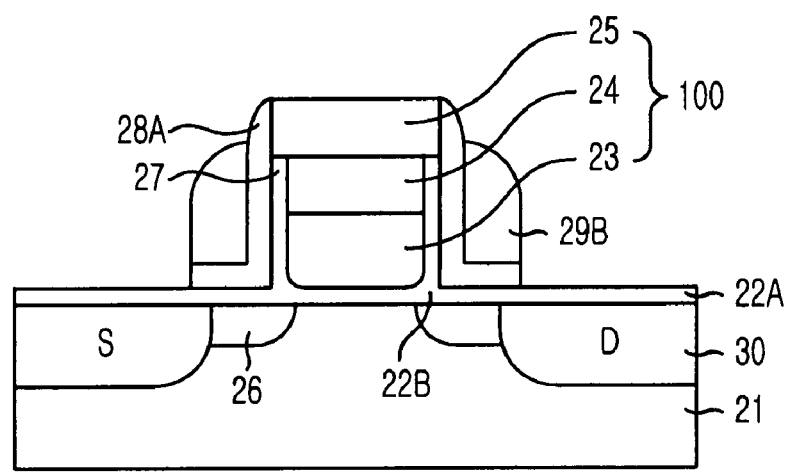
FIG. 4 is a cross-sectional view showing a non-volatile memory device taken along the line I-I' shown in FIG. 3.

FIG. 4 is a cross-sectional view showing a non-volatile memory device taken along the line I-I' shown in FIG. 3.

As shown, the non-volatile memory device includes: a gate insulation layer 22A formed on a substrate 21; a gate structure 100 formed on the gate insulation layer 22A; a pair of re-oxidation sidewall spacers 27 formed by using oxide; a pair of sidewall spacers 28A formed on both sidewalls of the gate structure 100 and made of nitride; a pair of conductive sidewall spacers 29B formed on the pair of sidewall spacers 28A; a pair of lightly doped drain (LDD) regions 26 formed in predetermined positions of the substrate 21 disposed beneath regions where the pair of re-oxidation sidewall spacers 27 and the pair of sidewall spacers 28A and the pair of conductive sidewall spacers 29B are formed; and a pair of source/drain regions 30 formed in another predetermined regions of the substrate 21 each disposed beneath an outer wall of the pair of conductive sidewall spacers 29B and connected respectively with the pair of LDD regions 26. Especially, the pair of conductive sidewall spacers 29B serves a role in trapping/detrapping charges and is formed by using polysilicon.

FIGS. 5A to 5G are cross-sectional views illustrating a method for fabricating the SONOS type non-volatile memory device shown in FIG. 4.

Figure 5A:
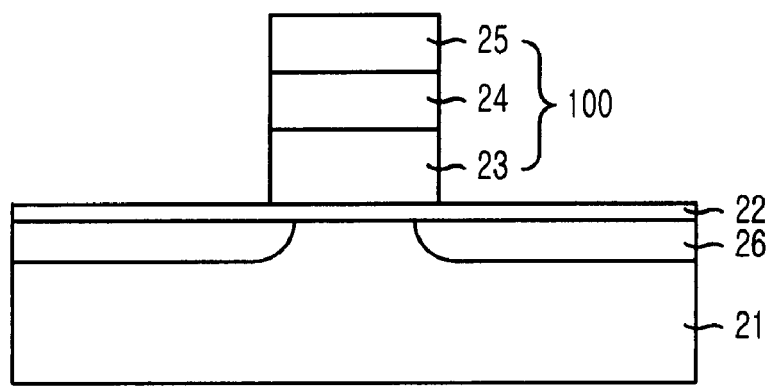
FIGS. 5A to 5G are cross-sectional views illustrating a method for fabricating a non-volatile memory device in accordance with the present invention.

Referring to FIG. 5A, a gate insulation layer 22 is formed on a substrate 21. It should be noted that prior to forming the gate insulation layer 22, a device isolation layer is formed in the substrate 21 and an ion-implantation process for controlling a threshold voltage and forming wells in the substrate 21 is performed. The gate insulation layer 22 is preferably a silicon oxide ($SiO_2$) layer obtained through performing a thermal oxidation process to a surface of the substrate 21.

Next, a first silicon containing electrode layer 23, a second electrode layer 24 based on a material selected from low resistance metals and a hard mask layer 25 are sequentially stacked on the gate insulation layer 22. In detail, the first silicon containing electrode layer 23 is selected from polysilicon and polysilicon germanium (Poly-$Si_{1-x}Ge_x$), where x representing an atomic ratio of germanium (Ge) ranges from approximately 0.01 to approximately 0.99. The second electrode layer 24 is selected from a group consisting of tungsten silicide (WSi), titanium silicide (TiSi), cobalt silicide (CoSi), nickel silicide (NiSi), chromium silicide (CrSi), a stack of tungsten nitride ($WN_x$), where x representing an atomic ratio of nitrogen ranges from approximately 0.1 to approximately 3.0 and tungsten and a stack of silicon nitride ($SiN_x$), where x representing an atomic ratio of nitrogen ranges from approximately 0.1 to approximately 3.0 and tungsten. Among the above listed materials, the tungsten nitride and the silicon nitride are used as diffusion barrier materials. Furthermore, the hard mask layer 25 is made of silicon nitride. Hereinafter, it is assumed that the first electrode layer 23 and the second electrode layer 24 are formed by using polysilicon and tungsten silicide, respectively.

Although not illustrated, a photoresist layer is formed on the hard mask layer 25 and is then patterned by employing a photo-exposure process and a developing process. With use of the photoresist pattern as an etch mask, the hard mask layer 25, the second electrode layer 24 and the first layer 23 are etched to form a gate structure 100. Afterwards, the photoresist pattern is removed through performing a stripping process.

Subsequent to the formation of the gate structure 100, an ion-implantation process is applied to the substrate 21. At this time, the ion-implantation process is for forming a pair of lightly doped drain (LDD) regions 26 by ion-implanting a low concentration of dopants. In case of an N-channel metal oxide semiconductor field effect transistor (MOSFET), an N-type dopant such as phosphorus (P) or arsenic (As) is used.

Figure 5B:
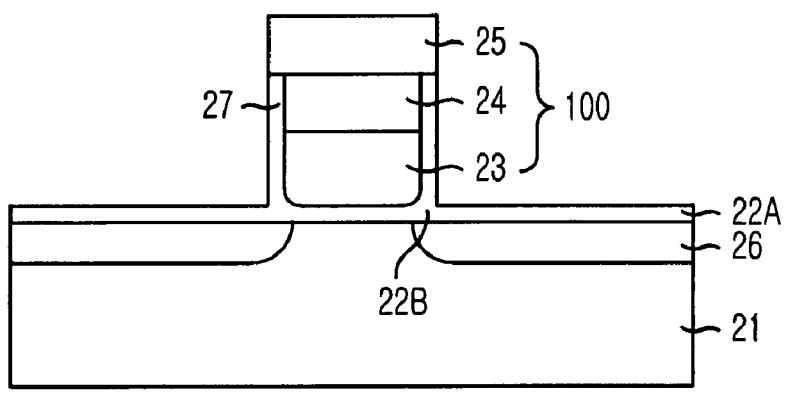

Referring to FIG. 5B, a gate re-oxidation process is performed under the target of oxidizing sidewalls of the first electrode layer 23 while a resistance of the gate structure 100 is maintained. Generally, during the above etching process for forming the gate structure 100, the gate insulation layer 22 shown in FIG. 5A becomes damaged. Thus, the gate re-oxidation process is performed to recover the damaged gate insulation layer 22 and micro-trenches generated during the etching process. Also, the gate re-oxidation process is performed to remove the polysilicon layer remaining on the substrate 21 and improve reliability by increasing a thickness of the gate insulation layer 22 disposed beneath edge portions of the gate structure 100.

Especially, depending on a thickness of the gate insulation layer 22 and a quality of the gate insulation layer 22, the gate insulation layer 22 disposed beneath the edge portions of the gate structure 100 affects a hot carrier characteristic, subthreshold voltage characteristics such as leakage currents and gate induced drain leakage currents (GIDL), a punchthrough characteristic, and a device operation speed. Therefore, the gate re-oxidation process is essentially performed.

Meanwhile, the gate re-oxidation process is carried out by employing a thermal process in an atmosphere of water vapor ($H_2O$), oxygen ($O_2$) or hydrogen ($H_2$). At this time, the thermal process is carried out at a temperature ranging from approximately 700° C. to approximately 900° C.

Here, a reference numeral 22A denotes the gate insulation layer recovered by the re-oxidation process, and a thickness of the gate insulation layer 22 disposed beneath the edge portions of the gate structure 100 increases because of a bird's beak 22B generated around the edge portions of the gate structure 100.

In addition to the oxidization of the first electrode layer 23 made of polysilicon, sidewalls of the second electrode layer 24 made of tungsten silicide become oxidized during the gate re-oxidation process, thereby forming a pair of re-oxidation sidewall spacers 27. Herein, the pair of re-oxidation sidewall spacers 27 is called re-oxidized silicon oxide.

Furthermore, to increase the thickness of the oxide layer and to improve the quality, it is possible to remove a remaining portion of the gate insulation layer through a pre-cleaning process and then form a new gate insulation layer by performing the gate re-oxidation process.

Figure 5C:
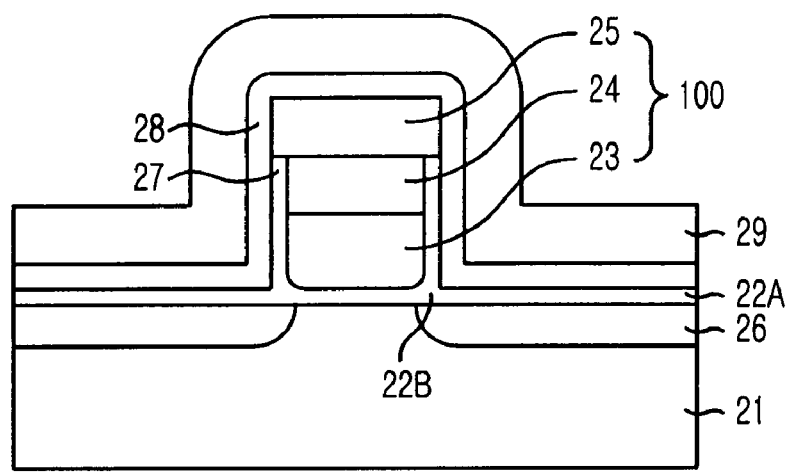

Referring to FIG. 5C, an insulation layer 28 is deposited on an entire surface of the above resulting substrate structure. At this time, the insulation layer 28 is formed by using one of silicon nitride ($Si_3N_4$) and silicon oxynitride (SiON). It is still possible to use oxide or a stack of oxide and nitride for the insulation layer 28. In case that the oxide is used, tungsten having a weak tolerance to the oxidization is contained in the gate structure 100 and, silicon oxide ($SiO_2$) is particularly employed as the insulation layer 28 through the use of an atomic layer deposition (ALD) method.

In addition, the insulation layer 28 can be formed by employing a single layer of an insulating material having a high dielectric constant such as oxynitride containing a metal selected from a group consisting of hafnium (Hf), zirconium (Zr), aluminum (Al), tantalum (Ta), titanium (Ti), cerium (Ce), platinum (Pt) and lanthanum (La), or by employing a stacked layers of these insulating materials.

Next, a conductive layer 29 based on polysilicon is formed on the insulation layer 28. At this time, the conductive layer 29 plays a role as a charge trapping medium. In addition to the use of polysilicon, the conductive layer 29 can be formed by using a low resistance metal selected from a group consisting of polysilicon germanium, Ti, W, Ta and Hf, or by using a metal nitride layer obtained by nitriding the selected metal among the above listed metals.

Figure 5D:
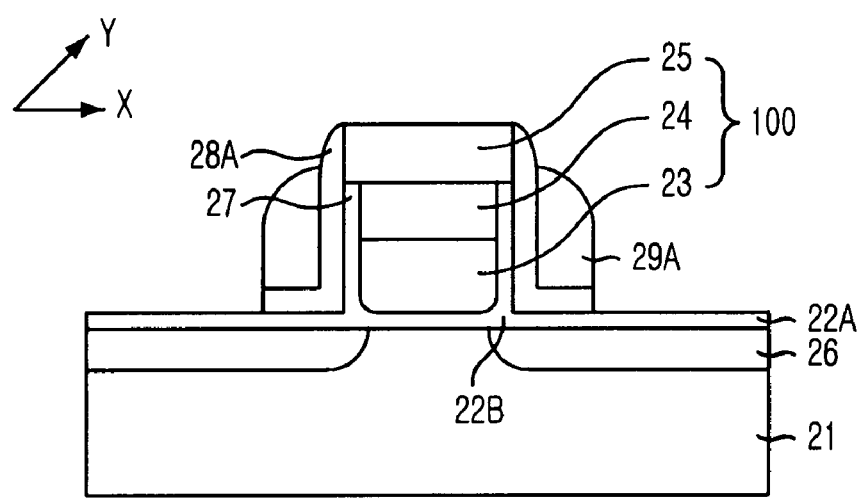

Referring to FIG. 5D, the conductive layer 29 is selectively etched, thereby forming a pair of primitive conductive spacers 29A on sidewalls of the gate structure 100 by performing a blanket etch-back process. At this time, the insulation layer 28 is also etched by the blanket etch-back process, thereby forming a pair of sidewall spacers 28A on sidewalls of the gate structure 100.

Because the pair of primitive conductive sidewall spacers 29A is based on a conductive material, i.e., the polysilicon layer, the pair of primitive conductive sidewall spacers 29A is formed only on the sidewalls of the gate structure 100 so to be insulated from neighboring primitive conductive sidewall spacers 29A of other unit cells. Preferably, the pair of primitive conductive sidewall spacers 29A is for insulating the unit cells arranged in a horizontal direction, i.e., in the X-axis in this drawing. As mentioned above, the pair of primitive conductive sidewall spacers 29A is for storing data of the SONOS type non-volatile memory device, and thus, the pair of primitive conductive sidewall spacers 29A is called a charge storage medium.

Also, the blanket etch-back process continues until the pair of primitive conductive sidewall spacers 29A has a height lower than that of the gate structure 100. For this outcome, the blanket etch-back process is performed under the target of exposing the patterned hard mask layer 25 and the recovered gate insulation layer 22A disposed above the active region. Therefore, the blanket etch-back process employs an etch recipe that gives an etch selectivity with respect to the recovered gate insulation layer 22A which is made of silicon oxide and allows the pair of sidewall spacers 28A to be etched simultaneously.

Figure 5E:
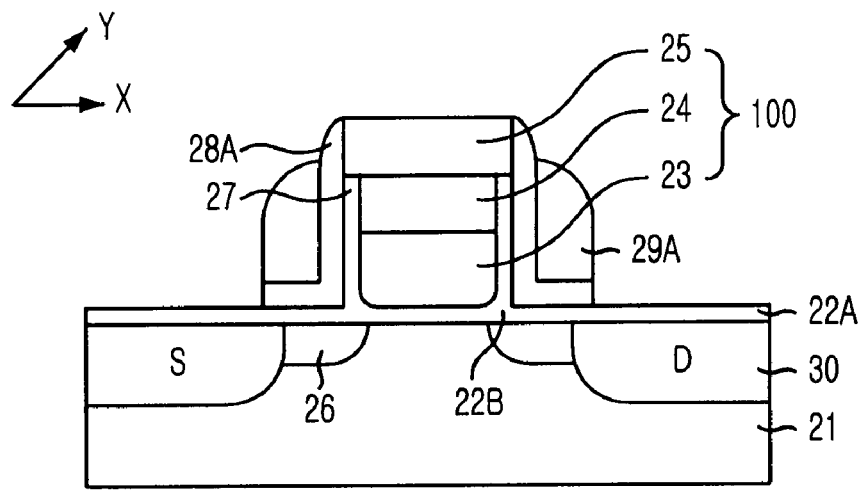

Referring to FIG. 5E, another ion-implantation process is carried out to form a pair of source/drain regions 30. Afterwards, a process for insulating the adjacent primitive conductive sidewall spacers 29A is applied. That is, the etching process described in FIG. 5D is for insulating the adjacent primitive conductive sidewall spacers 29A in the horizontal direction. However, since the pair of primitive conductive sidewall spacers 29A is based on a conductive material, i.e., polysilicon, it is required to insulate the adjacent primitive conductive sidewall spacers 29A in a vertical direction, i.e., the Y-axis. Detailed description on this process for insulating the adjacent primitive conductive sidewall spacers 29A in the Y-axis will be described later.

Figure 5F:
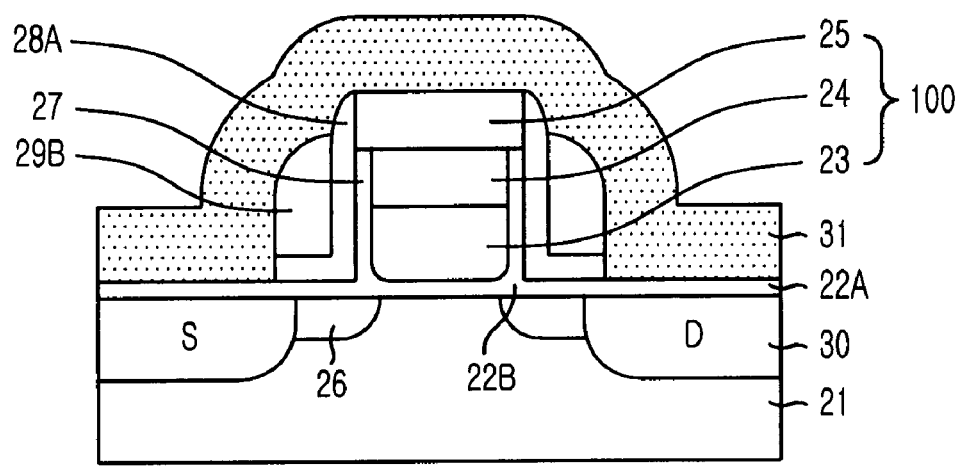

Referring to FIG. 5F, another etching process is performed to the pair of primitive conductive sidewall spacers 29A to obtain the pair of conductive sidewall spacers 29B insulated in the X-axis and in the Y-axis from other conductive sidewall spacers 29B of the adjacent unit cells. Then, a spacer nitride layer 31 serving as a barrier layer for a self-aligned contact (SAC) process is formed on the conductive sidewall spacers 29B and on an exposed portion of the recovered gate insulation layer 22A.

Figure 5G:
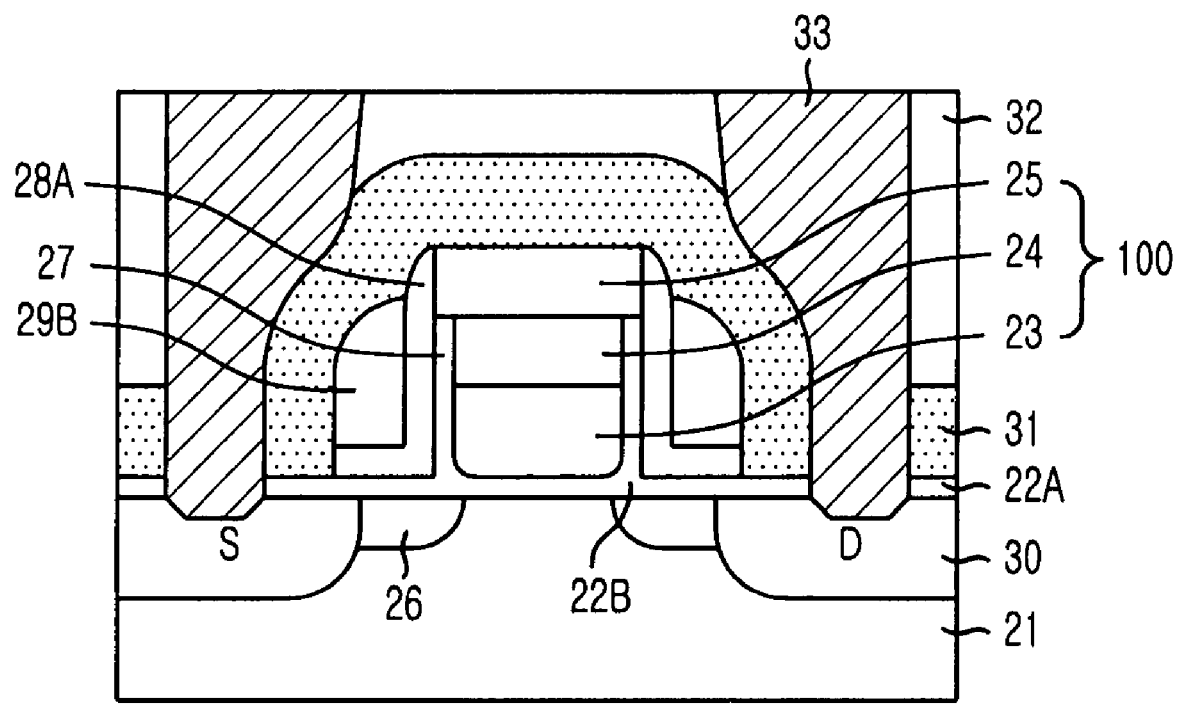

Referring to FIG. 5G, an inter-layer insulation layer 32 is formed on the spacer nitride layer 31. The above mentioned SAC process is then applied to etch the inter-layer insulation layer 32, so that a plurality of contact holes (not shown) for exposing the pair of source/drain regions 30 are formed. Subsequently, a conductive material is filled into the contact holes, thereby obtaining a plurality of bit line contacts 33.

Figure 6A:
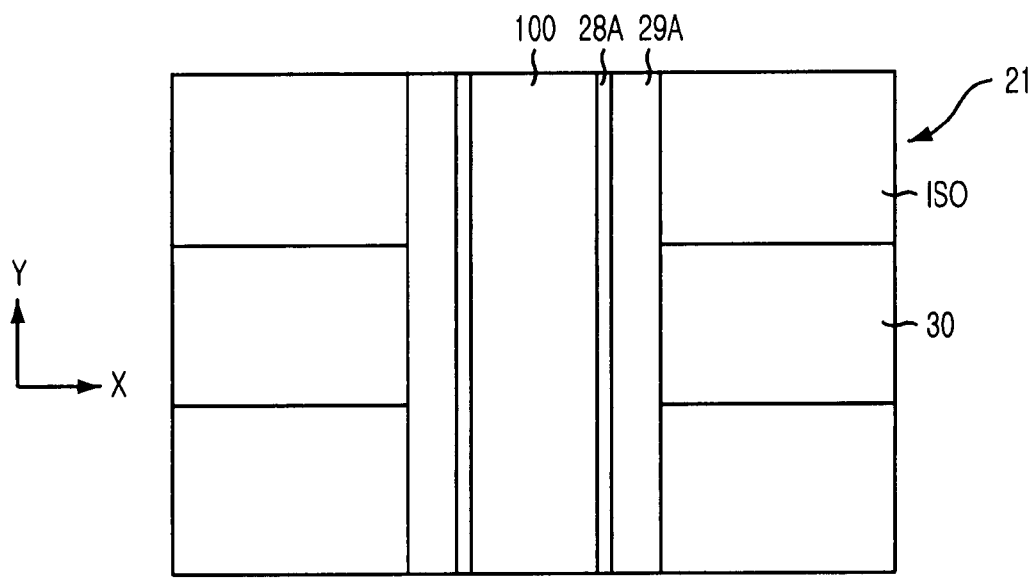
FIGS. 6A to 6C are diagrams illustrating a method for insulating a pair of conductive sidewall spacers.
Figure 6B:
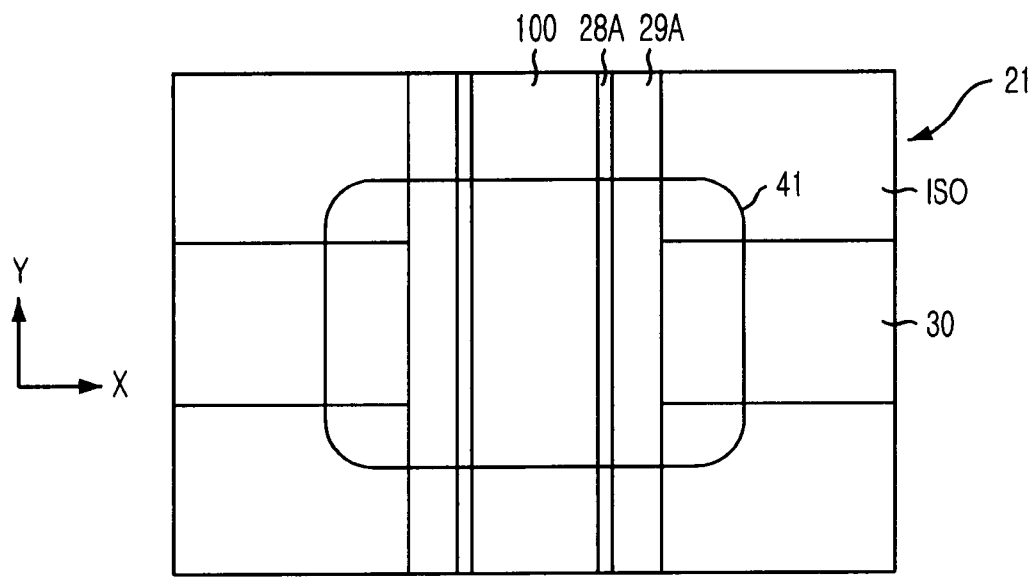
Figure 6C:
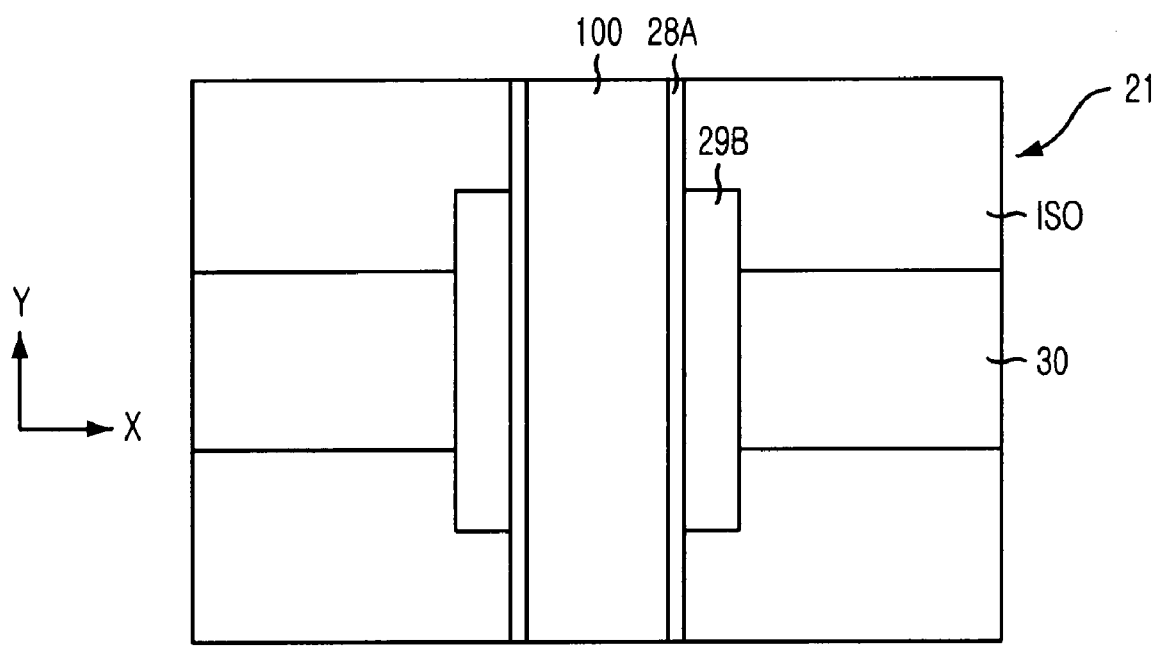

FIGS. 6A to 6C are diagrams illustrating a method for insulating a pair of conductive sidewall spacers in a SONOS type non-volatile memory device in accordance with the present invention.

FIG. 6A is a top view of the SONOS type non-volatile memory device shown in FIG. 5E.

As shown, the gate structure 100 is disposed on a predetermined region of the substrate 21, and the pair of sidewall spacers 28A and the pair of primitive conductive sidewall spacers 29A are arranged on sidewalls of the gate structure 100. The source/drain regions 30 are formed in the substrate 21 disposed in a region beneath edge portions of the pair of primitive conductive sidewall spacers 29A. Herein, description on device isolation regions ISO will be omitted. As described above, the pair of primitive conductive sidewall spacers 29A serves as charge trapping media for storing charges in order to store data of the SONOS type non-volatile memory device.

At this time, the pair of primitive conductive sidewall spacers 29A is insulated in the X-axis from adjacent primitive conductive sidewall spacers 29A of other unit cells. However, the pair of primitive conductive sidewall spacers 29A is not insulated in the Y-axis. Therefore, a process for insulating the pair of primitive conductive sidewall spacers 29A in the Y-axis is carried out.

Referring to FIG. 6B, a photoresist layer is formed on an entire surface of the substrate structure shown in FIG. 6A, and then, a photo-exposure process and a developing process are employed to pattern the photoresist layer. As a result of these processes, a photoresist pattern 41 is formed.

At this time, a horizontal side of the photoresist pattern 41 extends with a predetermined length from both edges of the pair of primitive conductive sidewall spacers 29A to the source/drain regions 30, while a vertical side of the photoresist pattern 41 overlaps with portions of the source/drain regions and the device isolation regions ISO.

Referring to FIG. 6C, the pair of primitive conductive sidewall spacers 29A shown in FIG. 6B is selectively etched by using the photoresist pattern 41 as an etch mask, thereby obtaining the pair of conductive sidewall spacers 29B. At this time, the etching process proceeds under an etch recipe that give an etch selectivity with respect to the pair of sidewall spacers 28A. Also, the etching process is an anisotropic etching process. Thereafter, the photoresist pattern 41 is removed by a stripping process.

The insulated conductive sidewall spacers 29B obtained after the above selective etching process with use of the photoresist pattern 41 are formed on the sidewalls of the gate structure 100 in each unit cell. Thus, the pair of conductive sidewall spacers 29B of the unit cells is insulated from each other in the X-axis and in the Y axis. Herein, each of the conductive sidewall spacers 29B has a rectangular shape of which the length is greater than the width.

The SONOS type non-volatile memory device is realized through trapping/detrapping charges into/from the conductive sidewall spacer 29B.

Hereinafter, operation of the SONOS type non-volatile memory device in accordance with the present invention will be described.

Table 1 shows bias conditions for a programming operation in accordance with the present invention.

TABLE 1

| Bias condition for programming first conductive sidewall spacer | V(WL) − V (P-well) High (+) bias voltage | V(BLC1) − V (BLC2) High (+) bias voltage | First conductive sidewalls Electron injection | E.g.) V(WL) = 3 V V(P-well) = GND V(BLC1) = 3 V V(BLC2) = GND |
|---|---|---|---|---|
| Bias condition for programming second conductive sidewall spacer | V(WL) − V (P-well) High (+) bias voltage | V(BLC2) − V (BLC1) High (+) bias voltage | Second conductive sidewalls Electron injection | E.g.) V(WL) = 3 V V(P-well) = GND V(BLC1) = GND V(BLC2) = 3 V |

Herein, 'WL' is a word line, and 'BLC1' and 'BLC2' are a bit line contact connected with a source region and a bit line contact connected with a drain region, respectively. Also, the first conductive sidewall spacer and the second conductive sidewall spacers are formed on the source region and the drain region, respectively. These reference denotations will be identically used to the following Tables 2 and 3.

Table 2 shows bias conditions for an erasing operation in accordance with the present invention.

TABLE 2

| Bias condition for erasing first conductive sidewall spacer | V(WL) − V (P-well) Low (−) bias voltage | V(BLC1) − V (BLC2) High (+) bias voltage | First conductive sidewall spacer Electron extraction | E.g.) V(WL) = −3 V V(P-well) = GND V(BLC1) = 3 V V(BLC2) = GND |
|---|---|---|---|---|
| Bias condition for erasing second conductive sidewall spacer | V(WL) − V (P-well) Low (−) bias voltage | V(BLC2) − V (BLC1) High (+) bias voltage | Second conductive sidewall spacer Electron extraction | E.g.) V(WL) = −3 V V(P-well) = GND V(BLC1) = GND V(BLC2) = 3 V |

Table 3 shows bias conditions for a reading operation in accordance with the present invention.

TABLE 3

| First conductive sidewall spacer | Second Conductive sidewall spacer | Shift of threshold voltage (Vth) (Forward: BLC1->BLC2): first conductive sidewall spacer | Shift of threshold voltage (Vth) (Reverse: BLC2->BLC1): second conductive sidewall spacer |
|---|---|---|---|
| Empty | Empty | No shift (Ref Vth) | No shift (Ref Vth) |
| (−) charged | Empty | Large (+) Vth shift | No shift (Ref Vth) |
| (−) charged | (−) charged | Large (+) Vth shift | Large (+) Vth shift |
| Empty | (−) charged | No shift (Ref Vth) | Large (+) Vth shift |

With reference to Table 1, as for the programming operation, i.e., the writing operation, the P-well and the second bit line contact BLC2 is applied with a ground voltage (GND) while the first bit line contact BLC1 and a gate structure, i.e. the word line WL, are applied with a high voltage, hot carriers are injected to the first conductive sidewall spacer of a NMOSFET. In this case, the first conductive sidewall spacer is charged negatively.

With reference to Table 2, to extract the negative charges stored into the first conductive sidewall spacer, the P-well and the second bit line contact BLC2 are applied with a ground voltage while the first bit line contact BLC1 and the gate structure are applied with a high bias voltage and a low bias voltage, respectively.

The same injection and extraction methods are applied to the second conductive sidewall spacer.

Next, with reference to Table 3, the reading operation is carried out by using a threshold voltage (Vth) of the MOSFET. Detailed bias conditions for the reading operation and the shift of the threshold voltage under such bias condition are shown in Table 3.

For instance, when the negative charges are stored in the first conductive sidewall spacer, the threshold voltage does not almost change as the device operates in a 'Reverse' direction from the second bit line contact BLC2 to the first bit line contact BLC1. On the contrary, the threshold voltage is shifted to a positive direction when the device operates in a 'Forward' direction from the first bit line contact BLC1 to the second bit line contact BLC2. Likewise, the charge state of the second conductive sidewall spacer hardly affects the shift to the forward direction, but affects the shift to the reverse direction. With use of the threshold voltage, the charge states of the first conductive sidewall spacer and the second conductive sidewall spacer can be separately detected and thus, it is possible to realize 2 bits per unit cell.

In accordance with the present invention, the use of the pair of polysilicon-based sidewall spacers provides an effect of operating a non-volatile memory device in high speed even in a low driving voltage. Also, there is another provided effect of obtaining a similar retention time to that of a flash memory.

The present application contains subject matter related to the Korean patent application No. KR 2004-0078223, filed in the Korean Patent Office on Oct. 1, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A non-volatile memory device, comprising:
    a substrate;
    a gate insulation layer formed on the substrate;
    a gate structure formed on the gate insulation layer;
    a pair of sidewall spacers formed on sidewalls of the gate structure;
    a pair of conductive sidewall spacers for trapping/detrapping charges formed on the pair of sidewall spacers;
    a pair of lightly doped drain regions formed in the substrate disposed beneath the sidewalls of the gate structure; and
    a pair of source/drain regions formed in the substrate disposed beneath edge portions of the pair of conductive sidewall spacers,
    wherein the pair of sidewall spacers is formed by using one of a single layer of oxynitride containing a metal selected from a group consisting of hafnium (Hf), zirconium (Zr), aluminum (Al), tantalum (Ta), titanium (Ti), cerium (Ce), platinum (Pt) and lanthanum (La) and stacked layers of oxynitride containing a metal selected from the group.

2. The non-volatile memory device of claim 1, further comprising a pair of re-oxidation sidewall spacers formed on the sidewalls of the gate structure.

3. The non-volatile memory device of claim 1, wherein the pair of conductive sidewall spacers is formed by using polysilicon.

4. The non-volatile memory device of claim 1, wherein the pair of conductive sidewall spacers is formed by using one of a low resistance metal selected from a group consisting of polysilicon germanium, titanium (Ti), tungsten (W), tantalum (Ta) and hafnium (Hf) and a material obtained by nitriding a low resistance metal selected from the group.

5. The non-volatile memory device of claim 1, wherein the pair of conductive sidewall spacers is formed to have a height lower than that of the pair of sidewall spacers.

6. The non-volatile memory device of claim 1, wherein the pair of sidewall spacers is formed by using a material selected from a group consisting of nitride, oxide, a stack of oxide and nitride.

7. The non-volatile memory device of claim 2, wherein the pair of re-oxidation sidewall spacers are formed by performing a gate re-oxidation process to the gate structure.

8. The non-volatile memory device of claim 1, further comprising:
    a spacer nitride layer formed on the pair of conductive sidewall spacers and the gate insulation layer;
    an inter-layer insulation layer formed on the spacer nitride layer; and
    a plurality of bit line contacts passing through the inter-layer insulation layer.

9. The non-volatile memory device of claim 1, wherein the gate structure is formed of a first conductive layer and a second conductive layer.

10. The non-volatile memory device of claim 9, wherein the first conductive layer is formed of polysilicon and the second conductive layer is formed of low-resistance metal.

11. The non-volatile memory device of claim 9, further comprising a hardmask layer formed on the second conductive layer.

* * * * *